May 6, 1958 C. P. PIPES ET AL 2,833,994

HIGH FREQUENCY LONG-LINE VARIABLY END-LOADED TUNER STACKABLE WITH SIMILAR TUNERS FOR INTERCOUPLING

Filed July 2, 1954 2 Sheets-Sheet 1

INVENTORS.
Clarence P. Pipes
John Y. Mitchell
By Mueller & Aichele Attys.

May 6, 1958 C. P. PIPES ET AL 2,833,994

HIGH FREQUENCY LONG-LINE VARIABLY END-LOADED TUNER STACKABLE WITH SIMILAR TUNERS FOR INTERCOUPLING

Filed July 2. 1954

2 Sheets-Sheet 2

INVENTORS.

Clarence P. Pipes

John F. Mitchell

By Mueller & Aichele Attys 2,833,994

HIGH FREQUENCY LONG-LINE VARIABLY END-LOADED TUNER STACKABLE WITH SIMILAR TUNERS FOR INTERCOUPLING

Clarence P. Pipes, Chicago, and John F. Mitchell, Berkeley, Ill., assignors to Motorola, Inc., Chicago, Ill., a corporation of Illinois Application July 2, 1954, Serial No. 440,902

11 Claims. (Cl. 333—73)

This invention relates generally to wave signal selectors and more particularly to a variable resonant cavity tuning system for ultra high frequency radio waves.

Wave signal selectors are widely used in radio apparatus to pass with favorable amplitude a selected range of frequencies while greatly attenuating certain other frequencies. When the signals applied are in the range of about 100 megacycles and above, resonant cavities often provide more satisfactory tuning apparatus than do lumped constant combinations. However, a disadvantage of such circuits using resonant cavities has been the rather expensive and bulky construction necessary. Chief causes of these faults are such factors as close machining tolerances required, the somewhat complicated coupling required between units, and the space needed for proper mounting of such devices.

It is an object of the present invention to provide an improved resonant cavity tuner which overcomes one or more of the objections to the prior art devices.

A further object is to provide an improved resonant cavity tuner of simple and inexpensive construction.

Still another object is to provide a tuner including a plurality of simple and improved high frequency tuning sections which may be efficiently coupled to each other at a desired degree of coupling.

A further object of the invention is to provide a cavity tuner including a plurality of improved high frequency tuning sections compactly connected together and occupying a minimum of space.

A feature of the invention is the provision of a resonant cavity tuning section including a rectangular shaped housing forming the outer conductor and a plate supported therein forming a center conductor, with a tuning member adjustably mounted at one end of the housing to permit changing the electrical characteristics of the section.

Another feature is the provision of a tuning circuit for high frequency wave signal apparatus which includes a plurality of resonant cavity tuning sections as described in the preceding paragraph electrically coupled to one another forming a complete tuning unit.

Still another feature of the invention is the provision of two or more high frequency tuning sections formed in rectangular shape and mounted adjacent to one another with a common side between adjacent tuners having an aperture therein, the size and position of which determine the coupling between the tuning sections.

Another feature of the invention is the provision of a superheterodyne receiver including a radio frequency tuning unit having a plurality of high Q cavity tuning sections which are positioned in juxtaposition and efficiently coupled together to provide a selective tuning unit for connection between an antenna and the first mixing stage in an ultra high frequency radio receiver, the tuner providing selectivity with a minimum of loss so that amplifiers are not needed before mixing may be effected and tube noise is thereby eliminated. A crystal mixer may be used so that tube noise is further avoided and a signal having a very high signal to noise ratio may be provided at the output of the first mixer.

Further objects, features, and the attending advantages of the invention will be apparent upon a consideration of the following description when taken in conjunction with the accompanying drawings in which.

In accordance with the present invention, a resonant cavity tuner for high frequency wave signals is provided in a simple and inexpensively formed construction. The tuner may include a plurality of sections each having a channel shaped member which together with a cover plate forms the cavity housing, and a plate member which extends along the interior of the channel shaped member and forms a center conductor. For tuning the cavity an adjustable U-shaped member is provided within the channel shaped member and this member surrounds the end of the plate member. Circuit connection may be made to the tuner by a connection extending through an aperture in the channel member to a selected point of the plate member. A plurality of tuning sections may be assembled together by utilizing the outside of the channel member of one section to enclose the open space of the channel of an adjacent section. Coupling between adjacent tuning sections may then be effected through an aperture in the common channel member. Variation in the dimensions in this aperture permits selection of the proper degree of coupling between the adjacent tuners.

The coupling to the tuning sections and between the tuner sections is very efficient which permits the use of a plurality of sections without the use of amplifying means interposed therebetween. Actually a multi-section tuner may be used to directly connect an antenna to a crystal mixer to thereby provide greatly reduced noise at the receiver input and simplify the construction thereof.

Figure 1:
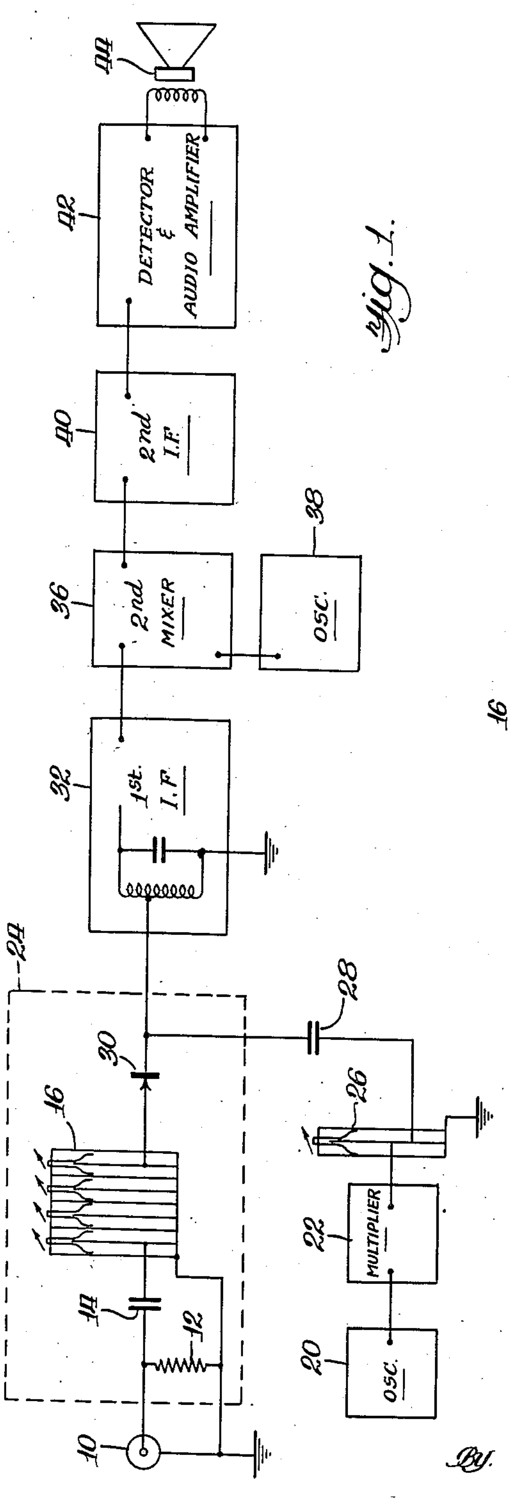
Fig. 1 is a diagram, partly schematic, of wave signal receiving apparatus utilizing the resonant cavity tuner of the present invention.

Turning now to the diagram of Fig. 1 there is shown wave signal receiving apparatus utilizing a tuning unit of the present invention. A source of signals is connected through the coupler 10 and applied across the resistor 12 through capacitor 14 to the resonant circuit structure 16. This resonant circuit includes a plurality of the tuning sections of the present invention, to be described in detail presently, which serve to provide the desired selection of the wave signal applied thereto.

The oscillator stage 20 applies a signal of selected frequency to the multiplier stage 22 which raises this signal to the necessary frequency for heterodyning with a received signal in the mixing stage 24. The oscillator signal is then applied to tuning section 26 through capacitor 28 to crystal diode 30 where it is heterodyned with the incoming or received wave signal to produce intermediate frequency signal. Merely by way of example, the incoming signal may be of the order of 450 megacycles and the signal mixed therewith of the order of 375 megacycles to produce a difference or intermediate frequency of 75 megacycles. This signal is then selected and amplified in a first intermediate frequency amplifier 32 and applied to a second mixer stage 36 where it is heterodyned with a further signal from oscillator stage 38. Thus a second, lower intermediate frequency signal is produced which is further amplified in the second intermediate frequency amplifier 40. The signal from amplifier 40 is demodulated and amplified in the detector and amplifier stage 42 so that it may operate a suitable reproducer 44. Although the tuner may be used in any desired application, it is shown used with a diode mixer stage since a plurality of sections or a tuning unit attenuates a selected signal very little and so is particularly useful in such a circuit.

Figure 2:
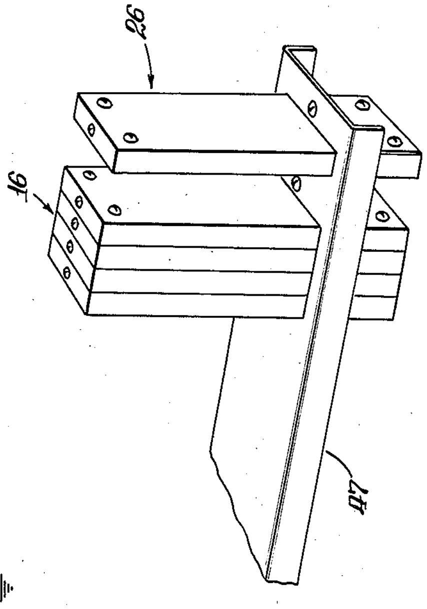
Fig. 2 shows the mechanical mounting of the tuner utilized in the circuit of Fig. 1.
Figure 3:
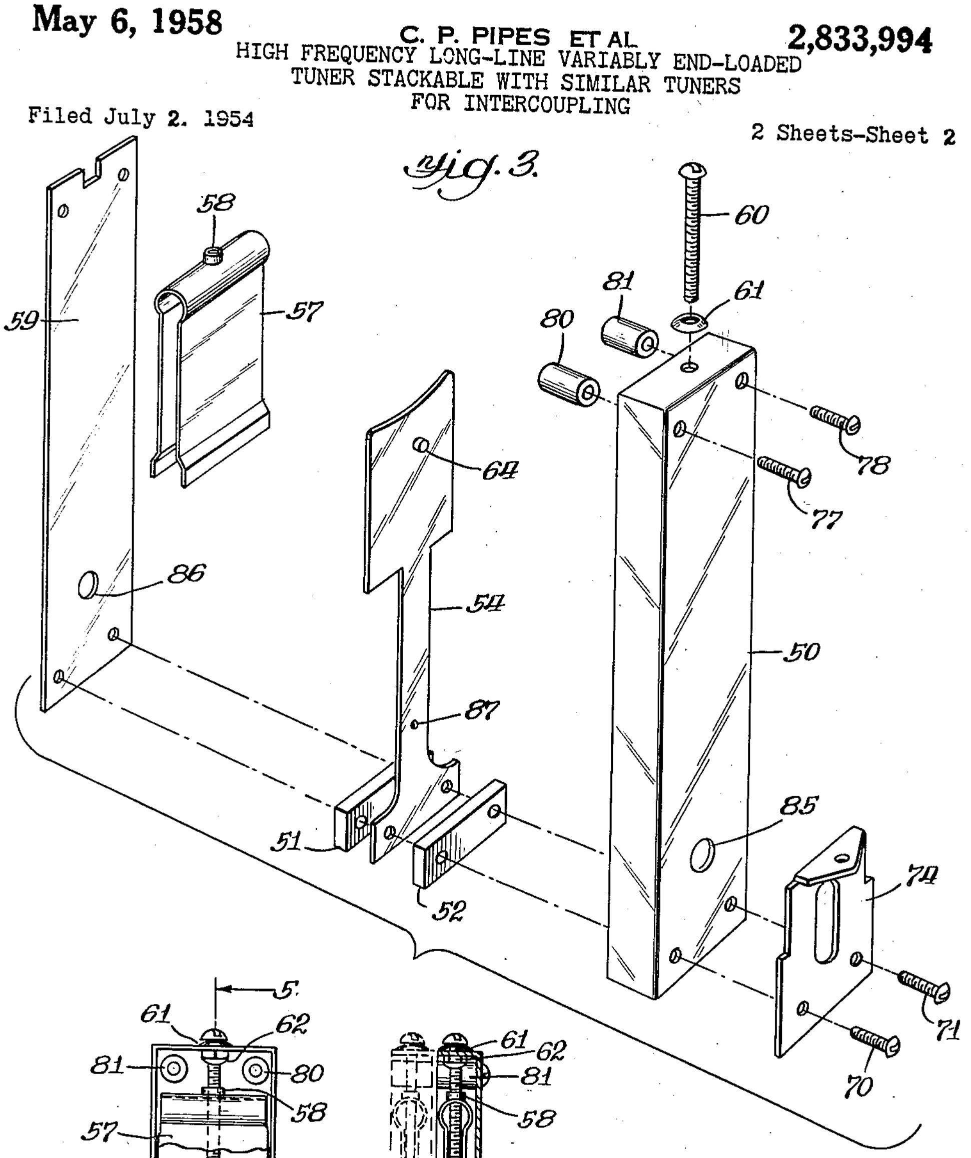
Fig. 3 is an exploded perspective view of a tuning section of the present invention.
Figure 4:
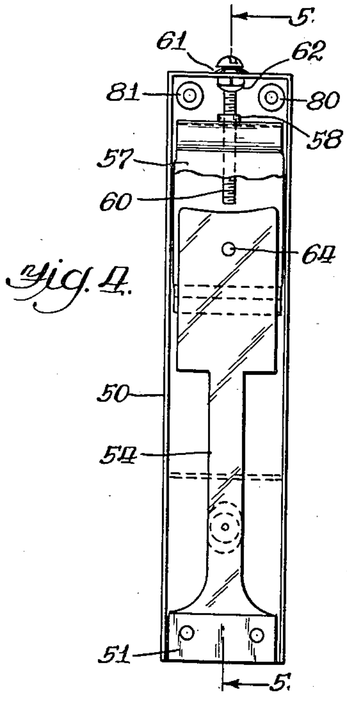
Fig. 4 is a plan view of the assembled tuning section of Fig. 3.

Fig. 2 shows a typical arrangement of the resonant cavity tuning sections for use in the circuit of Fig. 1, and it may be noted that the resonant circuit structure 16 is supported upright on a base 47, with the oscillator tuning section 26 supported nearby in a similar position. The actual construction of one section of such resonant cavity tuning units will now be explained in connection with Fig. 3.

The tuning unit is composed of a channel shaped body member 50 which has one open end and an open face. A pair of spacing members 51 and 52 are installed in the open end of the channel member 50 and between these members a center plate or center conductor is installed. This center plate extends a substantial distance along the interior of the channel member 50. The length, shape and thickness of the free end portion of the center plate 54, as well as the size of member 50, determine the operational frequency band of the tuner. This end portion is surrounded by a U-shaped tuning member 57 which has a tapped aperture 58 in the closed end thereof which is adapted to receive an adjusting screw 60. The adjusting screw is secured to the closed end of the channel member 50 by a washer 61 and an elastic stop nut 62. Therefore through rotation of the screw 60 the U-shaped tuning member may be positioned along the length of the interior channel housing member 50 and may surround a selected portion of the wide, free end of the center plate member 54 to provide a change in the effective electrical length of the unit and to permit a variation in the capacity between the center plate and the tuning member, thus permitting tuning of the unit over a range of frequencies. At the free end of the center plate member a short peg 64 composed of insulating material is inserted so that the plate 54 will remain centered between the sides of the U-shaped tuning member.

The open face of the channel housing member 50 may be enclosed by a cover plate 59 positioned thereacross and secured by the fastening members 70 and 71 which extend through one end of the channel member 50, the plate member 54 and the spacer bars 51 and 52 in order to secure all these members in fixed relation. A bracket member 74 may also be retained by members 70 and 71 to provide a convenient mounting means for the entire structure. The enclosing cover plate may also be secured to the channel housing member by the fastening members 77 and 78, and will be supported the proper distance from the open face of the housing by the spacer sleeves 80 and 81.

Figure 5:
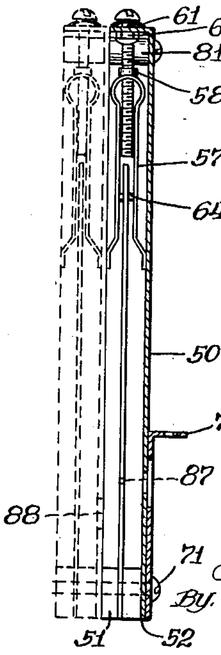
Fig. 5 is a sectional view along the line 5—5 of Fig. 4.

When more than one tuning section or cavity is to be utilized in the same circuit, it may be convenient to mount a second unit with the back of the channel housing member serving as an enclosing plate for the open face of a first unit. This arrangement is shown in Fig. 5. The fastening members 70, 71, 77 and 78 may then extend through all of the units mounted together, in which case only the final unit in such a structure would have an enclosing plate such as cover plate 59 to cover the open face thereof.

The U-shaped tuning member 57 has outwardly bent end portions which slidably engage the interior of the walls of a completely enclosed section as may be seen in Fig. 5. Therefore, when the screw member 60 is rotated, a selectable portion of the center plate member 54 will be surrounded by the sides of the tuning member and the ends of the sides will make slidable electrical contact with the interior of the tuning section.

The housing 50 and cover plate therefore form a cavity and the center plate 54 forms a center conductor therein. The resonant frequency of the cavity depends upon the dimensions of the parts thereof and, as previously mentioned, the tuning member 57 changes the effective dimensions of the cavity and the value of the electrical constants thereof to thereby change the resonant frequency.

In order to couple signals to and from the cavity, electrical connections can be made to the center plate 54 through an aperture 85 formed in the channel housing member 50 and an aperture 86 formed in cover plate 59 thereof. The electrical connection is completed at a selected position such as point 87 along the center plate 54. In order to couple signals between adjacent units in a combination of the cavity tuning sections, an aperture may be formed in the plate separating adjacent tuners. Aperture 88 shown in Fig. 5 illustrates this construction. It is noteworthy that when the tuning sections are so combined, the selection of the dimensions and position of the coupling aperture may be easily made with precision, so that an exact degree of coupling between units may be obtained. This is an important advantage of the present invention, and it is possible to closely approach critical coupling between adjacent units of these resonant cavity tuners.

Merely by way of an example, the following dimensions are given as illustrative of a tuner in accordance with the invention operative in the 450 megacycle range. The various members are all formed of material which is highly electrically conductive.

Interior of the channel housing member—4.937″ long x 1.000″ wide x .281″ thick
Center plate member—3.655″ long to the curve of the end x .781″ wide at the free end (.296″ wide at the narrow portion) x 19 gauge thickness
Free end of the wide portion of the center plate—1.156″ long
U-shaped tuning member—.984″ wide x 1¾″ long The location and size of the coupling apertures such as apertures 85 and 86, and of connection point 87, is determined by the desired degree of inter section coupling and the frequency of operation. In the band under consideration the apertures are in the range of one inch from the bottom of the housing and ¼″ to ½″ in diameter.

The resonant cavity tuner of the present invention provides, therefore, a simple structure which may be manufactured at very low cost. The parts may be formed, for example, by punch press. It is also noteworthy that the same sectional structure may be used singly or in a combination of any number to provide the desired degree of selectivity so that manufacturing is greatly expedited. Furthermore, the units are rectangular in shape so as to occupy a minimum of space, and when several are coupled together, they may be secured to one another so that the least possible space is required.

The electrical coupling between adjacent sections is very simply and efficiently effected through an aperture in the wall between the sections. This permits the utilization of several sections in combination as a tuning unit to obtain a selectivity curve of desired configuration with very low loss. Since losses are low and several sections may be efficiently coupled to one another to provide desired high selectivity, such a tuning unit may be utilized with a crystal mixing stage to select the received signals and convert the same to an intermediate frequency without the use of a single vacuum tube. This results in reduction in noise and distortion and has the advantage of low cost and simplicity of the receiver.

While a particular embodiment of the invention has been shown and described, it is understood that changes may be made and it is intended to cover all such changes and modifications as fall within the scope of the invention in the appended claims.

What is claimed is:

1. A high frequency wave signal tuner including an elongated rectangular housing of electrically conductive material forming a cavity, said housing having first and second end portions and two face portions, an elongated conducting plate member supported at one end thereof by said first end portion of said housing and extending within said housing toward said second end portion, a U-shaped tuning member within said housing and surrounding the end of said plate member opposite said first end portion, said tuning member having two arm portions engaging said face portions of said housing, adjusting means engaging said tuning member and said second end portion of said housing to permit selective positioning of said tuning member with respect to said plate member for determining the resonant frequency of said tuner, and an aperture in said housing for electrical connection to said plate member.

2. A high frequency wave signal tuner including an elongated rectangular housing of electrically conductive material forming a cavity, said housing having two end portions and two face portions, an elongated conducting plate member supported at one end thereof by one end portion of said housing and extending within said housing toward the other end portion thereof, an insulating spacer secured to said plate member, a U-shaped tuning member within said housing and surrounding the end of said plate member opposite said one end portion, said tuning member having two arm portions engaging said face portions of said housing, and engaging said spacer to position said plate member between said arm portions, and adjusting means engaging said tuning member and the other end portion of said housing to permit selective positioning of said tuning member with respect to said plate member and of the engagement of said arm portions and face portions for determining the resonant frequency of said tuner.

3. A high frequency tuning unit, including an enclosed rectangular electrically conductive housing having a pair of opposed end portions and at least one electrically conductive dividing wall extending between said end portions and forming a plurality of walled tuning sections, each of said tuning sections including a conducting plate member supported by one of said end portions and extending within the tuning section, a slidable U-shaped tuning member within each section and including a pair of sides surrounding a portion of said plate member and in electrical contact with the walls of the tuning section, and adjusting means secured to the other portion of said end portions and engaging said tuning member to permit positioning thereof for determining the response frequency of the tuning section.

4. A high frequency tuning unit, including an enclosed rectangular electrically conducting housing having first and second opposed end portions and at least one conductor wall extending between said end portions and forming a plurality of walled tuning sections, each of said tuning sections including a conducting plate member supported by said first end portion and extending within the tuning section, a slidable U-shaped tuning member within each section with a pair of sides surrounding a portion of said plate member and in electrical contact with the walls of the tuning section, adjusting means secured to said second end portion and engaging said tuning member to permit positioning thereof around said plate member and in contact with the tuning section walls for determining the response frequency of the tuning section, and an aperture in said conductor wall to provide wave guide coupling between said tuning sections.

5. A resonant cavity tuner, including in combination, a channel shaped member formed of electrically conductive material with a back portion, two side portions, one closed end portion, an open end and an open face; support means disposed in said open end to close the same; a conducting plate member with one end retained by said support means and a free end extending along said channel shaped member; conducting cover means enclosing said open face of said channel shaped member; adjusting means supported on said closed end portion; and an adjustable tuning member adjacent said free end of said plate member and in engagement with said adjusting means and in movable relation within said channel shaped member, said tuning member including a pair of spaced arm portions engaging said cover means and said back portion, so that movement of said tuning member within said channel shaped member changes the effective length of the cavity formed by said channel shaped member and said cover means for determination of the resonant frequency of said resonant cavity tuner.

6. A resonant cavity tuner, including in combination, a channel shaped member formed of electrically conductive material with a back portion, two side portions, a closed end portion, an open end and an open face; support means disposed in said open end to close the same; a conducting plate member with one end retained by said support means and a free end extending along said channel shaped member; an insulating member in said free end of said plate member; conducting cover means enclosing said open face of said channel shaped member; adjusting means supported on said one closed end portion; and an adjustable tuning member adjacent said free end of said plate member and in engagement with said adjusting means and in movable relation within said channel shaped member, said tuning member including a pair of spaced arm portions with ends thereof engaging said cover means and said back portion, said plate member extending into the space between said arm portions with said insulating member engaging said arm portions to space said plate member therebetween so that movement of said tuning member within said channel shaped member changes the effective length of the cavity formed by said channel shaped member and said cover means for determination of the resonant frequency of said resonant cavity tuner, said channel member also including an aperture for connection to a selected point of said plate member to provide electrical coupling to said tuner.

7. A wave signal tuning section for selection of high frequency signals, said section including in combination, an elongated, rectangular housing having an open face, an enclosed back section and first and second end sections, said housing also having a flat conductor member supported therein by said first end section, a tuner member supported in movable relation with said second end section, said tuner member including a pair of spaced arm portions with out-turned ends with said conductor member extending between said arm portions, a face plate member enclosing the open face of said housing to form a cavity tuner with said out-turned ends engaging the back section of said second housing and said plate member, whereby movement of said tuner member changes the characteristics within said housing to provide selection of high frequency signals, and a pair of apertures, one in the back section of said housing and one in said plate member to provide electrical coupling to said tuning unit.

8. A wave signal tuning unit for selection of high frequency signals, said unit including in combination, a plurality of elongated, rectangular housings each having an open face, an enclosed back section and first and second end sections, each of said housings also having a flat conductor member supported therein by said first end section, a tuner member supported in movable relation with said second end section, said tuner member including a pair of spaced arm portions with out-turned ends, and said conductor member extending between said arm portions, the housing being disposed with the back section of one enclosing the open face of another to form cavity tuners with said out-turned ends of the tuner members engaging the back sections of the enclosed housings, the back section of each housing having an aperture therein to provide electrical coupling to the cavity tuner whereby movement of said tuner member changes the characteristics within each housing to provide selection of high frequency signals therein.

9. A resonant cavity tuning unit including in combination, a plurality of conducting channel shaped members having enclosed back, side and end portions and open face portions, a conducting plate supported in the cavity defined by each channel member and extending in spaced relation from said back portion of each channel member to form a center conductor, said channel shaped members being supported in aligned relation with the back portion of one enclosing the open face portion of another to form a plurality of cavities, each back portion including an aperture therein providing electrical coupling to the associated cavity, and a conducting cover plate to enclose the open face portion of the end channel member in the aligned relation.

10. A resonant cavity tuning unit including in combination, a plurality of conducting channel shaped members having enclosed back, side and end portions and open face portions, a conducting plate supported in the cavity defined by each channel member and extending in spaced relation from said back portion of each associated channel member to form a center conductor, adjustable means disposed adjacent an end portion of each channel member to permit variation of the electrical length of the associated cavity, said channel shaped members being supported in aligned relation with the back portion of one enclosing the open face portion of another to form a plurality of cavities, each back portion including an aperture therein providing electrical coupling to the associated cavity, and a conducting cover plate to enclose the open face portion of the end channel member in the aligned relation.

11. A frequency selective unit including in combination, a conducting channel shaped structure having back, side, and end portions and an open face, conducting cover means for closing said open face to provide a conducting housing, a conducting plate supported within said housing and positioned in spaced relation with said back and side portions and said cover means, said conducting plate being electrically connected to one end portion of said channel shaped structure, a movable conducting tuning member in conducting relation within said housing adjacent the other end portion of said channel structure and in spaced relation with said conducting plate, said moveable conducting tuning member including a pair of spaced arm portions engaging said cover means and said back portion, and adjusting means for controlling the position of said tuning member for determining the frequency response of the unit, said housing further including means for coupling electrical signals thereto.

References Cited in the file of this patent

UNITED STATES PATENTS

| | | |
|---|---|---|
| 2,530,089 | Smith | Nov. 14, 1950 |
| 2,550,409 | Fernsler | Apr. 24, 1951 |
| 2,557,686 | Rado | June 19, 1951 |
| 2,594,895 | Felker | Apr. 29, 1952 |
| 2,638,544 | Schreiner | May 12, 1953 |
| 2,717,363 | Hubbard | Sept. 6, 1955 |